US012693574B2

(12) United States Patent
Hamer et al.

(10) Patent No.: US 12,693,574 B2
(45) Date of Patent: Jul. 28, 2026

(54) DISPLAY WITH LIGHT AMPLIFICATION

(71) Applicants: OLEDWorks LLC, Rochester, NY (US); The Penn State Research Foundation, University Park, PA (US)

(72) Inventors: John Hamer, Rochester, NY (US); Jon-Paul S. Desormeaux, Rochester, NY (US); Noel C. Giebink, State College, PA (US); Raju Lampande, University Park, PA (US)

(73) Assignee: OLEDWorks LLC, Rochester, NY (US)

( * ) Notice: Subject to any disclaimer, the term of this patent is extended or adjusted under 35 U.S.C. 154(b) by 739 days.

(21) Appl. No.: 18/050,729

(22) Filed: Oct. 28, 2022

(65) Prior Publication Data

US 2023/0134894 A1 May 4, 2023

Related U.S. Application Data

(60) Provisional application No. 63/275,026, filed on Nov. 3, 2021.

(51) Int. Cl.
*G02F 1/39* (2006.01)
*G09G 3/3233* (2016.01)
(Continued)

(52) U.S. Cl.
CPC ............. *G02F 1/39* (2013.01); *G09G 3/3233* (2013.01); *H10K 50/19* (2023.02); *H10K 59/00* (2023.02);
(Continued)

(58) Field of Classification Search
CPC ...... G02F 1/39; G09G 3/3208; G09G 3/3233; H10K 50/19; H10K 59/12; H10K 59/13;
(Continued)

(56) References Cited

U.S. PATENT DOCUMENTS 6,274,980 B1    8/2001  Burrows et al.
6,337,492 B1    1/2002  Jones et al.
(Continued)

FOREIGN PATENT DOCUMENTS

JP        2001006876 A    1/2001
JP          3426211 B2    7/2003
(Continued)

OTHER PUBLICATIONS

Ali et al., "Recent advances in small molecule OLED-on-Silicon microdisplays", Proc. of SPIE vol. 7415 74150Q-1, 2009.
(Continued)

*Primary Examiner* — Jessica M Merlin

(57) ABSTRACT

An integrated OLED display, preferably a microdisplay, comprising a base display that emits a pixelated image and an overlying stacked OLED amplification structure where the OLED amplification structure has at least two light-emitting OLED units separated by a charge-generation layer and a photodiode layer which generates a photocurrent upon exposure to light from the base display as well as the light emitted by the OLED units; wherein the pixelated emission from the base display causes pixelated light emission from the OLED amplification structure. The base display can comprise a single light emitting OLED unit on top of a silicon-based backplane with components nominally rated at 5V or less. The base display emits IR, NIR or red light to which the photodiode layer is sensitive. Cross-talk between the pixels may be controlled by the use of opaque optical dividers.

14 Claims, 7 Drawing Sheets

(51) Int. Cl.

| | |
|---|---|
| *H10K 50/19* | (2023.01) |
| *H10K 59/00* | (2023.01) |
| *H10K 59/12* | (2023.01) |
| *H10K 59/32* | (2023.01) |
| *H10K 59/38* | (2023.01) |
| *H10K 65/00* | (2023.01) |
| *H10K 71/80* | (2023.01) |

(52) U.S. Cl.
CPC ............. *H10K 59/32* (2023.02); *H10K 59/38* (2023.02); *H10K 65/00* (2023.02); *H10K 59/12* (2023.02); *H10K 59/1201* (2023.02); *H10K 71/80* (2023.02)

(58) Field of Classification Search
CPC ........ H10K 59/32; H10K 59/60; H10K 59/95; H10K 59/1201; H10K 65/00; H10K 39/34; H10K 71/80; Y02E 10/549
See application file for complete search history.

(56) References Cited

U.S. PATENT DOCUMENTS

| | | | |
|---|---|---|---|
| 6,653,796 | B2 | 11/2003 | Kimura |
| 6,692,820 | B2 | 2/2004 | Forrest et al. |
| 7,273,663 | B2 | 9/2007 | Liao et al. |
| 7,893,429 | B2 | 2/2011 | Okada et al. |
| 8,598,573 | B1 | 12/2013 | So et al. |
| 9,281,487 | B2 | 3/2016 | Kim et al. |
| 9,379,346 | B2 | 6/2016 | Forrest et al. |
| 9,741,957 | B2 | 8/2017 | Jung et al. |
| 10,032,834 | B2 | 7/2018 | Udaka et al. |
| 10,134,815 | B2 | 11/2018 | So et al. |
| 10,224,375 | B2 | 3/2019 | Popp et al. |
| 2004/0031965 | A1 | 2/2004 | Forrest et al. |
| 2005/0242710 | A1 | 11/2005 | Yamazaki et al. |
| 2009/0230383 | A1 | 9/2009 | Meng et al. |
| 2012/0286296 | A1* | 11/2012 | So ........................ H10K 65/00 257/E51.012 |
| 2020/0013978 | A1 | 1/2020 | Tanaka |
| 2021/0359004 | A1 | 11/2021 | Ai |

FOREIGN PATENT DOCUMENTS

| | | | | |
|---|---|---|---|---|
| JP | 3946484 | B2 | 7/2007 | |
| JP | 4018070 | B2 | 12/2007 | |
| JP | 6160671 | B2 | 7/2017 | |
| WO | 2007023707 | A1 | 3/2007 | |
| WO | WO-2013044200 | A1 * | 3/2013 | ......... H10K 59/8792 |

OTHER PUBLICATIONS

Ying, W., "Silicon Backplane Design for OLED-on-Silicon Microdisplay", MsE Thesis, Nanying Technological University, 2011.
Jang et al, J. Information Display, 20(1), 1-8 (2019).
Fujii et al, "4032ppi High-Resolution OLED Microdisplay", SID 2018 Digest, p. 613; US2019/0259337.
O. Prache, Active Matrix Molecular OLED Microdisplays, Displays, 22, 49-56 (2001).
Vogel et al, 2018 48th European Solid-State Device Research Conference, p. 90, Sep. 2018.
Cho et al, Journal of Information Display, 20(4), 249-255, 2019.
Ghosh et al., "Developing the World's Brightest WUXGA OLED Microdisplay", Information Display, 38, 19-23 (2022).
Springer et al, Optics Express, 24 (24), 28131 (2016).
Spindler et al, "High Brightness OLED Lighting", SID Display Week 2016, San Francisco CA, May 23-27, 2016.
Ren et al, 'Recent Progress in Organic Photodetectors and their Applications, Adv. Sci., 8, 2002418 (2021).
Strobel et al, "Organic photodiodes: printing, coating, benchmarks, and applications", Flex. Print. Electron., 4, 043001 (2019).
He et al., App. Phys. Let., 112, 243301 (2018).
Yuan, C.-H. et al., Sci. Rep. 6, 32324 (2016).
Heliotis et al, Applied Physics Letters, 87, 103505 (2005).
Xiao, "Recent Developments in Tandem White Organic Light-Emitting Diodes", Molecules, 24, 151 (2019).
Website: https://www.ravepubs.com/oled-silicon-come-new-joint-venture/; published 2018.
Website: https://www.kopin.com/kopin-to-showcase-latest-advances-in-its-lightning-oled-microdisplay-line-up-at-ces-2020/; dated Jan. 7, 2020.
Website: https://hdguru.com/calibration-expert-is-10000-nits-of-brightness-enough/; dated Jul. 26, 2018.

* cited by examiner

DISPLAY WITH LIGHT AMPLIFICATION

CROSS-REFERENCE TO RELATED APPLICATIONS

This application claims the benefit of U.S. Provisional Application No. 63/275,026 filed Nov. 3, 2021.

CROSS-REFERENCE TO RELATED APPLICATIONS

Reference is made to co-assigned and co-filed U.S. application Ser. No. 18/050,723, filed Oct. 8, 2022, entitled "PHOTONIC FEEDBACK ORGANIC PHOTODIODES AND UPCONVERTERS".

FIELD OF THE INVENTION

Embodiments relate to an integrated OLED device, preferably a microdisplay, with an OLED amplification unit comprising a multistacked OLED with a photodiode layer over a base display.

BACKGROUND

Typically, a microdisplay is less than two inches diagonal (approx. 5 cm) down to an ultra-small display size of less than 0.25" diagonal. In most cases, the resolution of the microdisplay is high and the pixel pitch is usually 5 to 15 microns. First introduced commercially in the late 1990s, they are commonly used for rear-projection TVs, head-mounted displays, and digital cameras. In recent years, devices like smart watches have taken advantage of the high resolution and low power consumption of these displays. Microdisplays are expected to proliferate with the global market projected at 20% compound annual growth rate in the next few years. One of the trends driving this growth will be the increasing adoption of near-eye displays and augmented reality devices and virtual reality devices such as head-mounted displays (HMDs), head-up displays (HUDs), and electronic view finders (EVFs).

There are two main categories of microdisplays. The first is a projection microdisplay, which involves a highly magnified image projected onto a surface. Types of projection microdisplays include rear-projection TVs and compact data projectors. The second is a near-to-eye display (NED), which consists of a highly magnified virtual image viewed through an eyepiece (such as a virtual reality headset or camcorder viewfinder). These displays are increasingly being used in HMDs and HUDs, especially in the military and medical industries.

Both types of microdisplays offer significant advantages over conventional direct-view displays such as flat-panel LCDs. Microdisplay advantages include the ability to produce a large image from a very small, lightweight source display unit, making them easy to integrate into space-constrained technology, such as wearables; large pixel capacity, producing high resolution and clarity; and greater power-efficiency as compared to other display types. The higher the resolution and brightness, and the lower the power consumption, the better quality the microdisplay. The challenge for microdisplay makers, however, has been relatively high production costs, together with the need for high brightness and long operational lifetime.

Microdisplays can be made from a range of display technologies, including Liquid Crystal-On-Silicon (LCoS); Liquid Crystal Displays (LCD); Digital Micromirror Devices (DMD); Digital Light Processing (DLP); and more recently, MicroLED (Light Emitting Diode) and Organic Light Emitting Diode (OLED).

LCD has dominated the microdisplay market in recent years. LCD technology offers high brightness, relatively low cost, and a relatively simple manufacturing process. Using LCDs, device manufacturers have been able to reduce the size of microdisplay components over time. LCD displays are currently being used in some HMDs, HUDs, EVFs, and thermal-imaging glasses and wearables. However, LCD microdisplays require a light source, or a backlight, in order to create an image together with a liquid crystal array in order to modulate the light. This technology has limitations, such as polarization, color space, maximum luminance limitation, LC temperature sensitivity, viewing angles, LCD transmission and extinction ratio, system limited dimensions and others, which may not provide all of the desired performance characteristics.

Microdisplays based on microLED technology could provide advantages over LCD microdisplays, such as self-emission, a larger color gamut, wide viewing angles, better contrast, faster refresh rate, lower power consumption (image dependent), and wide operation temperature range. Currently, microLED microdisplays are based on a standard Gallium Nitride (GaN) wafer, adopted from standard LEDs. This approach has the potential to provide high luminance display devices without lifetime issues at a relatively low price. In general, the standard GaN wafer is patterned into arrays of micro-LEDs. The microLED display is then produced by an integration of the micro-LED array and transistors. However, this approach has several manufacturing concerns including monolithic formation of the micro-LEDs over the transistors, pixel spacing, color generation, and spatial uniformity due to variations of color and luminance between the individual microLEDs.

OLED technology shares many of the attractive features of microLED technology for microdisplays. It is self-emissive, has excellent image quality, is very efficient comparing to LCD or LCoS, and has an ultra-high color rendition and wide color space. Self-emissive OLED devices have the important advantage over backlight devices (such as LCD) in that each pixel only produces the intensity required by the image, whereas backlighted pixels produce maximum intensity followed by absorption of the unwanted light. Moreover, formation of an OLED over the transistors is much easier and lower cost than formation of a microLED because OLED layers can be vacuum deposited or directly coated on the transistor backplane. On the other hand, OLEDs can have limited luminance and limited lifetime.

OLED microdisplays that utilize silicon backplanes are very attractive from the standpoint of cost and manufacturability. See, for example, Ali et al, "Recent advances in small molecule OLED-on-Silicon microdisplays", Proc. of SPIE Vol. 7415 74150Q-1, 2006; Ying, W., "Silicon Backplane Design for OLED-on-Silicon Microdisplay", MsE Thesis, Nanying Technological University, 2011; Jang et al, J. Information Display, 20(1), 1-8 (2019); Fujii et al, "4032ppi High-Resolution OLED Microdisplay", SID 2018 DIGEST, p. 613; US2019/0259337; Prache, Displays, 22(2), 49 (2001); and Vogel et al, 2018 48th European Solid-State Device Research Conference, p. 90, September 2018. Currently, silicon backplanes with low-voltage 5V drive transistors are available that use tandem (two light-emitting OLED units separated by one CGL) OLED units for light emission. See, for example, Cho et al, Journal of Information Display, 20(4), 249-255, 2019; https://www.ravepubs.com/oled-silicon-come-new-joint-venture/, published 2018; Xiao, "Recent Developments in Tandem White Organic Light-Emitting Diodes", Molecules, 24, 151 (2019).

Microdisplays require very high luminance in order to be useful under all environmental conditions, such as outdoors in bright sunlight. Even under controlled environment conditions such as in VR googles, very high luminance is needed to create an immersive visual experience. Very high luminance from the display allows the use of lower efficiency optics that are smaller, lighter weight, and less expensive, producing a headset that is more competitive. Currently, state-of-the-art OLED microdisplays do not provide as much luminance as desired. For example, a press release by one manufacturer of tandem OLED microdisplays describes full color products that may be able to deliver as much as 2.5 k nits, but admits that 5 k nits would be a more desirable goal (see https://www.kopin.com/kopin-to-show-case-latest-advances-in-its-lightning-oled-microdisplay-line-up-at-ces-2020/, dated Jan. 7, 2020). Some manufacturers propose that the goal should be 10 k nits or higher (see https://hdguru.com/calibration-expert-is-10000-nits-of-brightness-enough/, dated Jul. 26, 2018). See also Ghosh et al., "Developing the World's Brightest WUXGA OLED Microdisplay", Information Display, 38, 19-23 (2022).

One solution for increasing the total amount of light emitted from OLED devices is to stack multiple OLED units on top of each other, so total light emitted from the stack is the sum of the light emitted by each individual unit. However, while the total light emitted from such OLED stacks is additive based on the total number of individual OLED light-emitting units, the voltage required to drive the OLED stack is additive based on the voltages to drive each independent OLED unit. For example, if a light-emitting OLED unit requires 3 V to produce 250 nits at a given current, then a stack of two such units will require 6V to deliver 500 nits at the same current, a stack of 3 units will require 9V to deliver 750 nits and so forth.

Such OLED stacks are well known; for example, U.S. Pat. Nos. 7,273,663, 9,379,346, 9,741,957; 9,281,487 and US2020/0013978 all describe OLED stacks with multiple units of light-emitting OLED units, each separated by intermediate charge generation layers (sometimes also referred to as intermediate connecting layers). Springer et al, Optics Express, 24 (24), 28131 (2016) reports OLED stacks with 2- and 3-light-emitting units, where each unit has a different color. OLED stacks of up to six light-emitting units have been reported (Spindler et al, "High Brightness OLED Lighting", SID Display Week 2016, San Francisco CA, May 23-27, 2016).

However, without regard to the type of light generator used, microdisplays need to provide as much light as possible from as small an individual pixel as possible. For most light generators, there is a direct correlation between power and the amount of light generated. Higher levels of light generation will require more power to be applied. However, there is also a direct correlation between the power that can be supplied by the backplane circuits used to control a pixel and the pixel size. In particular the transistors used in the backplane circuitry are sized according to their power ratings. Transistors that are capable of handling higher power levels are larger in size than transistors with lower power ratings. This results in an increase in pixel size because pixel circuits capable of applying higher power levels will be larger in size than pixel circuits which are only capable of applying lower power levels. Thus, it can be difficult to provide a microdisplay with very small pixels where the individual pixels generate very high levels of light.

One way to avoid this fundamental problem would be to use a microdisplay that requires low power (so that the backplane circuits and resulting pixel size can be very small) as an image generator and separately amplify its light output to increase the total amount of light output. For example, a microdisplay with small pixels that requires low power (voltage) can be used to generate an image, although such an image may have an insufficient brightness. A light amplification unit, which may require a separate nonimage-wise power source, can receive that initial image and amplify (increase the level) it, while retaining its image-wise pattern, so that an image is generated at the required brightness from an image that is generated from a source requiring low power but is not capable of providing the desired level brightness directly.

Avalanche photodiodes, which are highly sensitive semiconductor photodiode detectors that exploit the photoelectric effect to convert light into electricity, are well known (i.e., see https://en.wikipedia.org/wiki/Avalanche_photodiode) and can provide high signal gain. Inorganic semiconducting materials such as Silicon, Selenium and Germanium can be used in such devices. Organic avalanche photodiodes are also well known (i.e., see Ren et al, 'Recent Progress in Organic Photodetectors and their Applications", Adv. Sci., 8, 2002418 (2021)). and Strobel et al, "Organic photodiodes: printing, coating, benchmarks, and applications", Flex. Print. Electron., 4, 043001 (2019). It should be noted that photodiode, photoconductor and photodetector are terms that can be used interchangeably to describe these types of devices and modes of operation.

U.S. Pat. No. 6,653,796 describes an OLED which has a pixelated light-emitting part with a photoconductive layer between the electrodes over an external light-emitting part. The external light-emitting part, which is specifically a passive-matrix device, generates an image which passes through an insulating layer to the photoconductive layer within the pixel sections of the light-emitting part which amplifies the light.

U.S. Pat. No. 7,893,429 discloses a passive matrix OLED where a light-emitting layer and a photoconductive layer can be stacked upon each other.

JP03946484B2 and JP03426211B2 describe an OLED with a photodiode layer between the electrodes that can cause photo-amplification upon light excitation.

JP2001006876A describes an OLED with a photodiode layer between the electrodes that can cause photomultiplication and transformation of 400 nm input light to 520 nm output light.

U.S. Ser. No. 10/134,815 describes an infrared-to-visible up-conversion device which can include an OLED coupled to a photodetector.

JP6160671B2 describes a light receiving/light emitting device where light is received from the backside by a photoconductive layer which generates current which is passed to an OLED so that light is emitted from the front side.

U.S. Ser. No. 10/032,834 describes a device with a first organic photoelectric conversion unit and a second organic photoelectric conversion unit that is disposed on the first organic photoelectric conversion unit and is different in spectral sensitivity from the first organic photoelectric conversion unit, wherein one of the first organic photoelectric conversion unit and the second organic photoelectric conversion unit acts as a light receiving unit and the other acts as a light emitting unit.

He et al., App. Phys. Let., 112, 243301 (2018) describes a photodiode layer located between two OLEDs.

U.S. Pat. No. 6,692,820 describes a combination of organic photodetector layers with exciton blocking layers for use in light receiving devices such as solar cells.

JP04018070B2 describes an OLED with a photodiode layer where the OLED emits light at one time and the photodiode senses light at a different time.

Yuan, C.-H. et al. Sci. Rep. 6, 32324 (2016) describes an OLED with a photoconductive layer which exhibits emission when irradiated with a 780 nm laser:

Heliotis et al, Applied Physics Letters, 87, 103505 (2005) describes coating R, G or B polymers (or a W emitting mixture of the 3) over a near-blue (360-390 nm) emitting microLED display. Hermsdorf, J., Applied Physics Letters, 101(14), 141122, 2012 describes coating luminescent polymers over a blue-emitting LED.

US20210359004 and U.S. Ser. No. 10/224,375B2 describe the use of a device where a photoconductive layer is located adjacent to an OLED.

WO2007023707A1 discloses a bidirectional optical communication method and a system therefor by a bifunction organic diode which carry out light emission and light detection by means of a diode unit having organic EL and organic photodiode functions to enable bidirectional optical communication using one optical route.

Vertically stacked independently operated OLEDs, each which their own electrodes, are known. See U.S. Pat. Nos. 6,274,980 and 6,337,492. Both of the OLEDs are driven according to the same image signal.

US20090230383 describes a passive-matrix OLED device where the emission from each pixel is amplified by an integrated vertical organic light-emitting transistor.

US20050242710 describes the use of internal bank structures to prevent optical cross-talk between pixels in an OLED device.

None of the above references relate to pixelated display applications with the desired high level of image-wise emission that is based on image-wise emission generated at low voltages.

SUMMARY

It has been found that an integrated OLED device, which relies on a low voltage base display to generate the image, can provide high light emission through the use of an amplification multi-stack OLED unit with an associated photodiode layer. In particular, integrated low-voltage displays or microdisplays with very high brightness can be produced by locating a stacked multilayer OLED structure with an internal organic photodiode layer over a base low-voltage display or microdisplay. In particular, the image-wise light emission from the base display can be received by an OLED amplification unit comprising a photodiode (PD) layer associated with a stacked organic light emitting diode (OLED) with two or more light-emitting units separated by a charge-generation layer (CGL), wherein exposure of the PD to light from the base display light causes the OLED units to emit. Some of the emission from the stacked OLED is then absorbed by the PD which facilitates an avalanche mode via a self-amplifying positive feedback loop. This amplification results in much higher brightness than that produced just by the base display or by the OLED stack without the photodiode.

Some important features of the invention include, but are not limited to:

An integrated OLED display comprising a base display that emits a pixelated image and an overlying stacked OLED amplification structure where the stacked OLED amplification structure has at least two light-emitting OLED units separated by a charge-generation layer, and a photodiode layer which generates a photocurrent upon exposure to light from the base display as well as the light emitted by the OLED units; wherein the pixelated emission from the base display causes pixelated light emission from the OLED amplification unit.

The above integrated OLED display where the photodiode layer is located between the OLED light-emitting unit closest to the base display and the emitting surface of the base display.

Any of the above integrated OLED displays where the stacked OLED amplification structure has a top and a bottom electrode connected to a power source that supplies a non-imagewise bias that is applied uniformly across all pixels. The photodiode layer can be located between the two electrodes of the stacked OLED amplification structure. The photodiode layer can be is located between the OLED light-emitting unit closest to the base display and the bottom electrode.

Any of the above integrated OLED displays where the emission from the base display is monochromatic and the emission from the stacked OLED amplification structure is multicolor or where the emission from the base display is monochromatic and the emission from the stacked OLED amplification structure is monochromatic but a different color from the base display. The base microdisplay can emit IR, NIR or red light. The stacked OLED structure can emit green light.

Any of the above integrated OLED displays where the base display comprises a light emitting OLED display on top of a silicon-based backplane with individually addressable pixels and control circuitry. The base display can be an OLED microdisplay where the control circuitry in the backplane comprises low-voltage components which are nominally rated at 5V or less.

Any of the above integrated OLED displays where the stacked OLED structure has at least some common layers across all pixels which additionally comprises optical dividers between the pixels of the OLED amplification structure wherein the optical dividers are located under the common layers of the stacked OLED structure and above the substrate. The optical dividers may be located under the common layers of the stacked OLED structure and above the photodiode layer.

Any of the above integrated OLED displays wherein the top surface of the integrated display or front emission surface of the OLED amplification structure contains materials that absorb the same spectrum of light that is emitted by the base display.

It should be noted that any of the above features may be combined in any order or extent without limitation as desired, except when incompatible.

DETAILED DESCRIPTION

Figure 1:
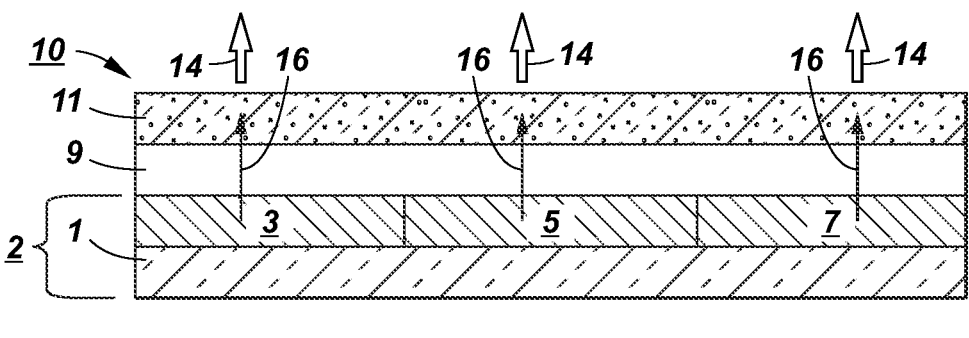
FIG. 1 shows a basic cross-section schematic view of an integrated high emission, low-voltage display 10.

For the purposes of this disclosure, the terms "over" or "above" mean that the structure involved is located above another structure, that is, on the side opposite from the substrate. "Top", "uppermost" or "upper" refers to a side or surface further from the substrate while "bottom", "bottommost" or "bottom" refers to the side or surface closest to the substrate. Unless otherwise noted, "over" should be interpreted as either that the two structures may be in direct contact or there may be intermediate layers between them. By "layer", it should be understood that a layer has two sides or surfaces (an uppermost and bottommost) and that multiple layers may be present and is not limited to a single layer.

"LEL" means light-emitting layer. For light-emitting units or layers, R indicates a layer that primarily emits red light (>600 nm, desirably in the range of 620-660 nm), G indicates that a layer primarily emits green light (500-600 nm, desirably in the range of 540-565 nm) and B indicates a layer that primarily emits blue light (<500 nm, desirably in the range of 440-485 nm). IR indicated a layer that primarily emits infrared light, generally understood to encompass wavelengths from around 1 millimeter (300 GHz) to the nominal red edge of the visible spectrum, around 700 nanometers. Near-IR (NIR) refers to infrared light just outside the range of human vision, generally considered to be in the range of around 750 nm-900 nm. UV indicates a layer that primarily emits ultraviolet light, generally considered to be wavelengths shorter than around 400 nm. It is important to note that light-emitting layers can produce some degree of light outside the indicated range, but the amount is always less than the primary color. Y (yellow) indicates that a layer that emits significant amounts of both R and G light with a much lesser amount of B light. W (white) indicates that a layer emits significant amounts of R, G and B light, although not necessarily at exactly equal amounts. Unless otherwise noted, wavelengths are expressed in vacuum values and not in-situ values.

In the context of this application, a display has pixels and/or subpixels arranged in a pattern. Each pixel or subpixel emits light at some level and period of time (frame) to create an emission pattern that represents a pixelated image.

An individual OLED light-emitting unit can emit a single color of light (i.e., R, G or B). The single color of light may be generated within the OLED unit by a single layer with one or more emitters of the same color or multiple layers, each with the same or different emitters whose primary emission fall within the same color. A single OLED unit can also provide a combination of two colors (i.e., R+G, R+B, G+B) within a single OLED unit by having: one layer with a single emitter that emits two colors of light, one layer with two different emitters, or combinations of multiple separate layers, each emitting a single, but different, color. A single OLED unit may also provide white light (a combination of R, G and B) by having one layer that emits all three colors of light or combinations of multiple separate layers, each emitting a single (but different) color, the sum of which is white. The light-emitting layers within a single OLED unit may be either directly adjacent to each other or separated from each other by interlayers. The individual light-emitting units may also contain various kinds of non-emitting layers such as hole transporting layers, electron-transporting layers, blocking layers and others known in the art to provide desirable effects such as promoting emission and managing charge transfer within the light-emitting unit.

A stacked OLED structure contains at least two or more individual OLED light-emitting units which are always separated from another unit by a non-light emitting charge generation layer (CGL). If there is no CGL present, it has a "one stack" structure, even though it may have more than one light-emitting layer that makes up the single OLED unit. In other words, to be considered as a separate OLED light-emitting unit, it must be separated from another light-generating unit by a CGL; however, it is not necessary for a light-generating unit to have an adjacent CGL on both sides. The OLED light-generating units on the top and bottom of the stack will generally have only one adjacent CGL. There is typically no need to use a CGL between a light-emitting unit and one of the top or bottom electrodes, although a CGL could be used if desired. Within the stacked OLED structure, the individual OLED light-emitting units can be placed in any order between the top and bottom electrodes.

FIG. 1 shows a basic cross-section schematic of the integrated high emission, low-voltage display 10 of the invention. There is a low emission, low-voltage base display 2 which comprises a backplane 1, which serves the substrate for the entire device 10, and light-emitting pixels 3, 5, 7. The backplane 1 contains the control circuitry that causes the pixels 3, 5, 7 of the base display to emit light at the appropriate intensity and time according to an image signal provided by an image controller, which is external to the backplane. The individual pixels 3, 5, 7 emit light in the direction indicated by arrows 16. Over the front (light-emitting) surface of the base display 2, there may be an optional connection layer 9 which is transparent to the emission of the base display 2. Over 9, there is a stacked OLED amplification structure 11. The stacked OLED amplification structure 11 comprises a photodiode (PD) layer and multiple OLED units, each separated from another by a CGL. The PD layer is sensitive to the light emitted by the base display as well as the light from the OLED units. The light emitted by the individual pixels 3, 5, 7 of the base display 2 is received (in an image-wise fashion) by the PD layer in the stacked OLED amplification structure 11. According to the level of emission received from the display 2, the internal photodiode layer causes the OLED units within the stacked OLED amplification structure 11 to emit correspondingly. Since the PD layer is also sensitive to the light emitted by the OLED units, a feed-back loop is created (sometimes referred to as an avalanche mode) resulting in the amplification of the signal generated by the base display 2. However, since only a fraction of the light generated from the OLED units is absorbed by the PD layer, multiple OLED units (with increased emission over a single OLED unit) are required to cause the PD layer to enter an avalanche mode. Thus, the stacked OLED amplification structure 11 greatly increases the amount of overall pixelated emission from the top surface of the integrated OLED device (as indicated by arrows 14) over that directly emitted from the base display 2 or from the OLED stack without the PD layer (which would not have the avalanche mode feature). In most cases, the emission from the base display 2 should not contribute to or be part of the observed image.

The stacked OLED amplification structure 11 is associated with a photodiode layer. If there is no input light from the base display, no photocurrent is generated and there is no emission from the stacked OLED structure. However, light from the base display can cause the PD to generate photocurrent flow through the stacked OLED structure to cause emission. In particular, the presence of light from the base display being incident upon the PD generates an electron-hole pair (called charge carriers). Transfer of charge carriers to and through the stacked OLED structure causes any one or combination of the light-emitting units within the stacked OLED structure to generate photons resulting in output emission. Because the OLED structure is associated or coupled to the PD, at least one photon generated by the stacked OLED structure can be absorbed (or re-absorbed) by the PD. Any one or combination of absorbed (or re-absorbed) photons can generate an additional electron-hole pair within the PD. The additional electron-hole pair can cause the stacked OLED structure to generate additional photon(s) resulting in an increase in the emission output from the OLED structure, thus forming a self-amplifying feedback loop (avalanche mode). Thus, the photocurrent generated by the exposure of PD by input light from the base display drives the stacked OLED structure, and particularly causes the stacked OLED structure, together with a CGL which provides increased light as well as electron-hole pair generation, to operate in avalanche mode.

In some embodiments, the stacked OLED amplification structure 11 comprises at least two individual OLED light-emitting units that are separated by a charge-generation layer (CGL) and located between two electrodes. In other embodiments (designated as 11A), the stacked OLED structure has one electrode where the PD layer serves as the other electrode. Thus, at a minimum, the stacked OLED structure has a first light-emitting unit/CGL/second light-emitting unit (also referred to as a "two-stack" or tandem structure). Along with the stacked OLED portion, the OLED amplification structure 11 also has a photodiode layer associated or coupled with it so that light generated by the stacked OLED portion can impinge on the PD. Ideally, the PD is a layer located below (closer to the base display) the stacked OLED structure.

To drive multiple OLED units, charge generation layers (CGLs; sometimes also referred to as connector or intermediate layers) are located between the individual OLED light-emitting units. This is because the CGLs are structured so that electrons and holes are generated upon voltage application, and injected to the adjacent organic emissive layers. Hence, the use of a CGL can cause even further amplification of light emission from the OLED units since the CGL can generate additional electron-hole pairs from the charge due to the photocurrent generated by the PD. In particular, the use of multiple OLED units within the stacked OLED structure provides an increased ability to provide high light emission while the intermediate CGL between the units further amplifies the photocurrent provided by irradiation of the PD. In this way, emission can be maximized even from a small photocurrent from the PD.

Many different kinds of CGLs have been proposed and may be used in the OLED stack. For example, see U.S. Pat. No. 7,728,517 and US 2007/0046189. For the formation of a CGL, an n-p semiconductor heterojunction, which is located at the interface of n-type and p-type layers, is typically needed for the charge generation and creation of electron-hole pairs. Thus, CGLs will have two or more layers. For example, n-doped organic layer/transparent conductive layer, n-doped organic layer/insulating material, n-doped organic material layer/metal oxide layer, and n-doped organic material layer/p-doped organic material layer have all been reported. A desirable metal oxide for CGLs is MoO3. In some instances, the n-layer and p-layer may be separated by a thin intermediate layer. Often, the CGL is arranged so that the n-layer is closer to the anode and the p-layer is closer to the cathode.

One desirable formulation for a CGL has three layers; an electron-transport material doped with a n-dopant (for example, Li), a thin intermediate layer of the same (but undoped) electron-transport material, and a hole-transport material doped with a p-dopant. Suitable electron-transport and hole-transport materials, along with n-dopants and p-dopants suitable for use in a CGLs are well-known and commonly used. The materials may be organic or inorganic. The choice of appropriate materials is not critical and any may be selected based on their performance. The thickness of the CGL should desirably be in the range of 200-450 Å. In many instances, the CGL will have an ETL on the anode side and an HTL on its cathode side to help improve charge transport and help separate the charge-generating dopants (if present) from the LEL in the light-emitting units.

The CGL is not light-sensitive. It creates electron-hole pairs due to an electrical field created between the OLED electrodes and not from light generated from the surrounding OLED light-emitting units. It is different from a photodiode layer.

An important consideration in increasing the overall amount of light emission through amplification is the number of light-emitting units present in the OLED amplification structure of the device so that there are multiple sources of light within the structure. The number of individual OLED light-emitting units within the OLED amplification unit is limited only by the overall thickness of the OLED. As the number of OLED units increase, the total amount of light emitted increases, but the thickness of the package and the complexity of the manufacturing process increase as well. Typically, the amount of increased emission by adding another unit may decrease somewhat as the number of units is increased. That is, a device with two OLED units may have 2× the emission of a one-unit device, but a 3-unit device may only have 2.8× the emission of a one-unit device. The threshold voltage also generally increases linearly with the number of individual OLED units.

It is contemplated that the OLED amplification structure to include at least two OLED units separated by a CGL. It is desirable that the OLED amplification structure should have at least three OLED light-emitting units (and two CGLs), which will provide increased luminance over a tandem (two OLED units/one CGL) stacked OLED structure. However, OLED amplification structures with at least four OLED light-emitting units (and three CGLs) can be more desirable. Even as many as ten or more OLED light-emitting units (with n−1 CGLs) can be useful. The minimum number of OLED units within the OLED amplification structure required will be determined by the minimum number that will facilitate avalanche mode operation and the self-amplifying feedback loop.

Stacked OLED structures with multiple light-emitting units can have very high emission. For example, stacked OLED structures can easily generate 100-10,000 nits of light, especially green. This may generate more light than the user may need (e.g. 10× to 1000×) for some applications.

Some night vision applications only require 1-10 nits at peak emission brightness, so the choice regarding the number of OLED units necessary is dependent on the design requirement of the device.

The purpose of the integrated display 10 as described is to produce an image that can be perceived by the human visual system. Thus, the light emitted from the top surface of the device by the stacked OLED amplification structure 11 should be visible light. Desirably, the emission should be a W image composed from four sub pixels (RGBW), three subpixels (RGB) or two subpixels (for example, B and orange). Preferably, the W image is RGB. The emission can also be monochromatic, desirably G.

Figure 2:
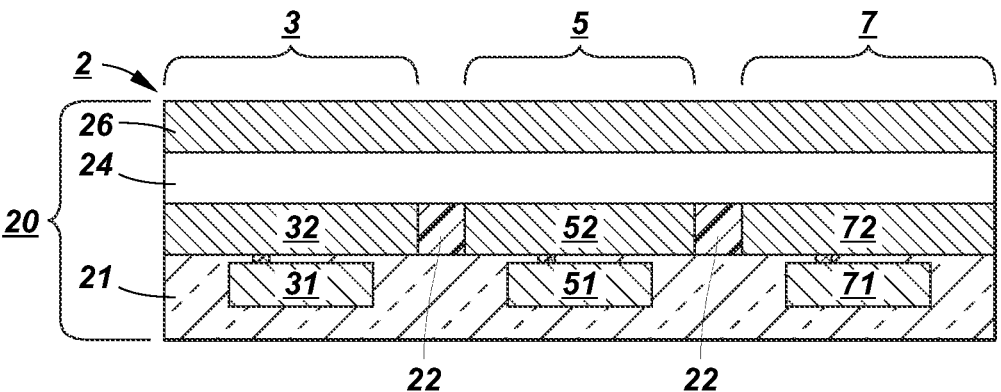
FIG. 2 shows a basic cross-section view of an example of a base display 20.

FIG. 2 shows a cross-section of one example 20 of a low-emission, low-voltage OLED base display 2 suitable for use in 10. In this example, 20 is a monochromatic OLED microdisplay where each subpixel emits the same type of light. The silicon backplane 21 contain individual pixel circuits 31, 51, 71 that control the emission of subpixels 3, 5, 7. The circuits 31, 51, 71 are individually connected to first electrode segments 32, 52, 72, which are electrically isolated from each other by insulating material 22. Over the electrode segments 32, 52 and 72 (and the electrically insulating material 22 located between them), is a common organic layer 24 for light emission. A common organic layer 24 is desirable since the emission from subpixels 3, 5, 7 is absorbed by a common photodiode layer in the stacked OLED amplification structure 11. In other examples, the organic layer for light emission may not be common to all first electrode segments, but divided so that each pixel can emit different kinds of light from each other so long as the photodiode layer is sensitive to the different kinds of emitted light. Over 24 is a common second electrode 26, which is transparent so that light generated within 24 is emitted through the top surface of 26. If the silicon backplane is opaque, the electrode segments 32, 52 and 72 may be reflective. The electrode segments may be composed of two layers; a reflective bottom layer such as metallic Ag and a top layer of transparent metal oxide such as ITO. Desirably, the base display is a microdisplay where the circuits 31, 51, 71 are rated at 5V or less.

Figures 3, 4:
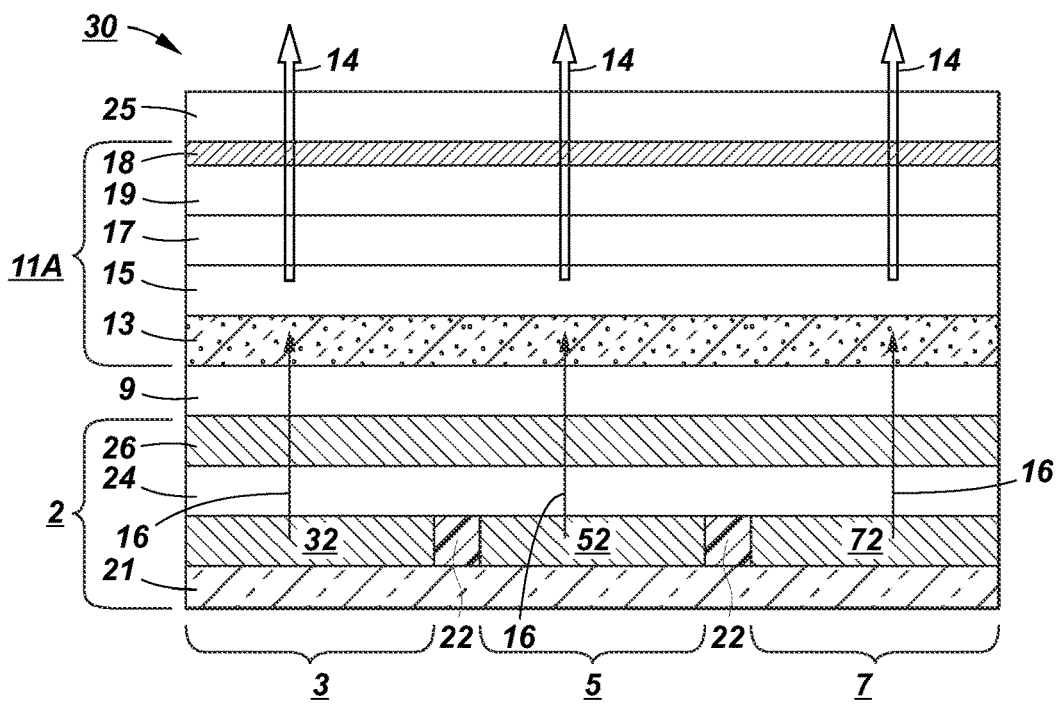
FIG. 3 shows a cross-section view of an integrated display device 30.
FIG. 4 shows a cross-sectional view of an integrated display device 40.

FIG. 3 shows a cross-sectional view of an integrated display device 30 which contains a base display 2, an optional connection layer 9 and a stacked OLED amplification structure 11A. As shown in FIG. 2, base display 2 has subpixels 3, 5, 7 (with corresponding first (bottom) electrode segments 32, 52 and 72) that are separated by insulating material 22 over a backplane 21. Over the electrode segments are organic emitting layer 24 and transparent second electrode 26. As indicated by arrows 16, image-wise light is emitted by the pixels 32, 52, 72 through the transparent connection layer 9 and which is received by the photodiode layer 13 which is part of the OLED amplification structure 11A. The emission from the base display 2 causes a photocurrent to be formed in the photodiode layer 13. This current can flow into a first OLED stack 15 and a second OLED stack 19, which are separated by a charge-generation layer 17 (CGL), to a transparent top electrode 18. Stacked OLED amplification structure 11A then emits pixelated light (as indicated by the arrows 14) as a function of the light emitted from the base display 2. Some of the emitted light also returns to the PD layer 13 to cause the OLED amplification structure 11A to eventually operate in an avalanche mode. Over the top of the OLED units 15, 19 are a transparent top electrode 18 and a top surface 25, which may be composed of several layers such as encapsulation which provides protection to the entire device from air and water penetration, color filters, as well as layers or layer segments which filter out external light to prevent it entering the device. As a result of the pixelated emission from the base display 2 and the stacked OLED amplification structure 11A operating in an avalanche mode, the pixelated emission from the base display 2 is amplified and results in increased pixelated emission from the front surface of the amplification structure 11A as indicated by the arrows 14. There may be additional non-emitting layers within 11A to help modulate current flow and improve efficiency of emission. In 30, the only source of power for OLED amplification unit 11A is the photocurrent generated by the PD 13 due to exposure from the light from the base display 2. As shown, 30 is a two-stack device since it contains two OLED light-emitting units 15, 19 separated by a CGL 17.

FIG. 4 shows a cross-sectional view of an integrated display device 40 which contains a base display 2 (same as in FIG. 3), an optical connection layer 9 and a stacked OLED amplification structure 11. In the stacked OLED amplification structure 11 of 40, a transparent bottom electrode 12 is located between the photodiode layer 13 and the first OLED unit 15 so that the PD layer 13 is not within the two electrodes 12, 18 of the stacked OLED structure. Top surface 25 and a transparent top electrode 18 are located over OLED unit 19 (there may be non-light emitting layers between 19 and 18). A power source 23 is electrically connected between the electrodes 12, 18. Power source 23 applies a bias between the electrodes at a level which is insufficient to cause emission from the OLED units whenever there is no emission from the base display 2. This is possible because the photodiode layer 13 is electrically resistive when not exposed to light and so, the bias from the power source is not high enough to cause current flow between the OLED electrodes. However, when light from the base display 2 (indicated by arrows 14) is received by the photodiode layer 13, it produces current and becomes electrically conductive and so, current will flow between the electrodes and the OLED units will emit. This will greatly increase the amount of luminance (as indicated by arrows 16) from 11 due to the added bias from the power source 23. It should be noted that the bias is applied uniformly across all pixels and is nonimage-wise. Power source 23 is independent and separate from the image signal supplied to the base display 2.

It should be noted that because the power source 23 applies a constant voltage across all pixels, the OLED amplification structure 11 cannot be directed operated as a pixelated display. The integrated device uses the stacked OLED amplification structure 11 to amplify the pixelated emission from the base display 2 to create a pixelated display suitable for a viewer.

Figure 5:
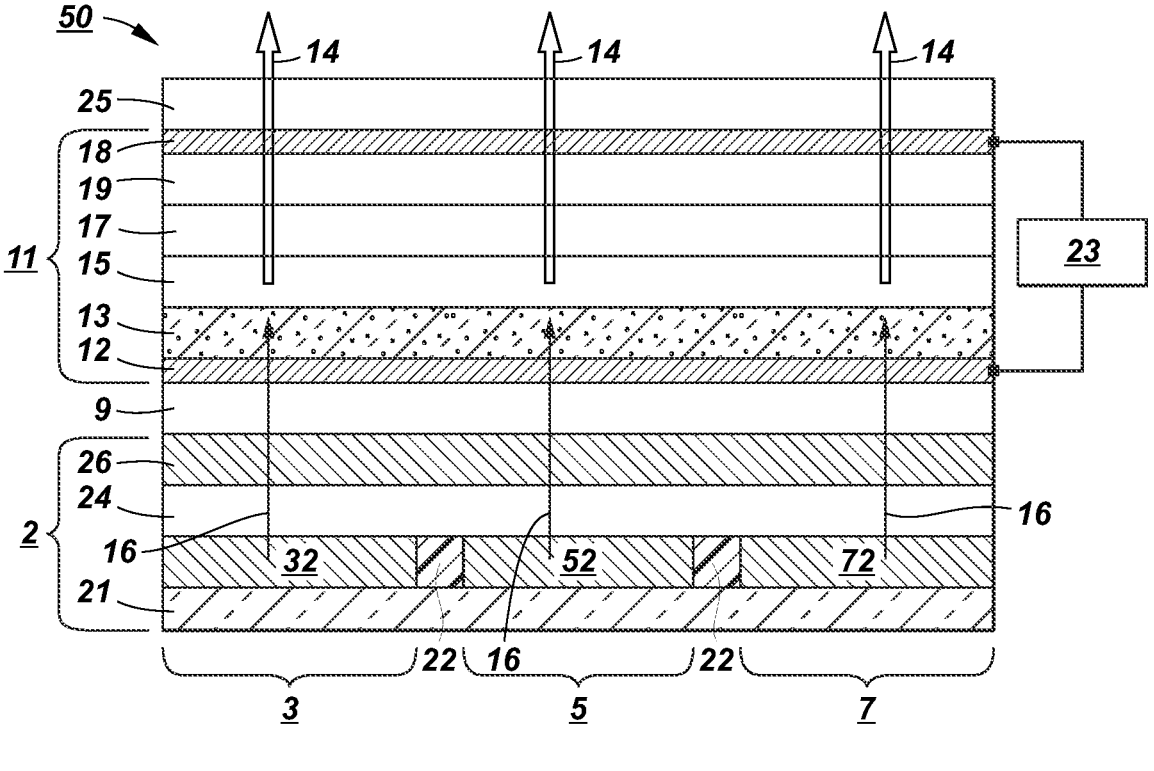
FIG. 5 shows a cross-sectional view of an integrated display device 50.

FIG. 5 shows a cross-sectional view of an integrated microdisplay device 50 which contains a base display 2 (same as in FIG. 3), a connection layer 9 and a stacked OLED amplification structure 11. In the stacked OLED amplification structure 11 of 50, the bottom electrode 12 is located between the connection layer 9 and the photodiode layer 13 so that the photodiode layer 13 is located between the two electrodes 12, 18 of the stacked OLED amplification structure 11.

It is also possible that in the embodiments where electrodes are part of 11 (as illustrated by FIGS. 4 and 5) that the electrodes are unbiased and power source 23 is deactivated during some or all of the period of emission by the base display 2. In such instances, emission from 11 is due solely to the charge provided by the photodiode layer 13 (as in 30) and is unassisted from the external power source 23. However, a bias may be applied during the "OFF" period between frames in order to prevent continued emission during this period. It may also be possible to only apply the bias for only part of the frame time.

The base display 2 can be based on any type of light generating engine; i.e., LCD, LED or OLED. Base display 2 is desirably an active-matrix device with arrays of sub-pixels that are independently operated and controlled by circuitry located in the backplane 1 (i.e., see 31, 51, 71 in 21 as shown in FIG. 2). A low-voltage monochrome display is very desirable since the backplane 1 of the base display 2 can be made with low-voltage circuits which allow for smaller pixel sizes, this increasing pixel pitch. It also reduces power demand, resulting in longer battery life or allows for a smaller battery and an overall reduction in weight which are both important consideration for many microdisplay applications. However, a low-voltage base display 2 may not be capable of emitting high enough luminance for direct viewing as desirable for the target display applications. Since its emission will be magnified by the overlying OLED amplification structure 11, it is not required that the base display 2 have high luminance and so can be operated at a low-voltage.

Desirably, the base display is a microdisplay and the integrated device is also a microdisplay as well.

OLED microdisplays (often called "AMOLEDs") that use a silicon backplane are preferred as the base microdisplay 2. They consist of an active matrix of OLED pixels, which generate light (luminescence) upon electrical activation, that have been deposited or integrated onto a thin-film transistor (TFT) array located on a silicon chip (which can serve as backplane 1). Desirably, OLEDs with a single light-emitting unit (single stack) are used for the base microdisplay since single stack OLEDs are low voltage and require the minimum amount of power to operate. Such single stack OLEDs are also very thin, which will help to minimize the thickness and weight of the complete integrated device.

Silicon chips (backplanes) are derived from a silicon wafer (also called a slice or substrate). They are a thin slice of semiconductor, such as a crystalline silicon (c-Si), used for the fabrication of integrated circuits. The wafer serves as the substrate for microelectronic devices built in and upon the wafer. It undergoes many microfabrication processes, such as doping, ion implantation, etching, thin-film deposition of various materials, and photolithographic patterning. Finally, the individual microcircuits are separated by wafer dicing and packaged as an integrated circuit. Wafers are grown from crystal having a regular crystal structure, with silicon having a diamond cubic structure with a lattice spacing. When cut into wafers, the surface is aligned in one of several relative directions known as crystal orientations. Silicon wafers are generally not 100% pure silicon, but are instead formed with an initial impurity doping concentration of boron, phosphorus, arsenic, or antimony which is added to the melt and defines the wafer as either bulk n-type or p-type. For background, see Chapter 7 in "Flat Panel Display Manufacturing", Souk, L., Ed., 2018. It is desirable that the silicon backplane be a single-crystal Si wafer.

In order to provide control circuitry for the operation of the OLED pixels, thin-film transistors (TFTs) along with other components such as capacitors, resistors, connecting wires, and the like are provided on the surface of the silicon wafer. For example, see T. Arai, "High Performance TFT Technologies for the AM-OLED Display manufacturing", Thesis, Nara Institute of Science and Technology, 2016; M. K. Han, Proc. of ASID '06, 8-12 October, New Delhi; U.S. Pat. No. 9,066,379; and U.S. Ser. No. 10/163,998. It should be understood that the TFTs may or may not incorporate the silicon wafer as part of the TFT structure or may be prepared from separate materials deposited on the surface.

The manufacture of silicon backplanes with suitable control circuitry is a very well known, understood and predictable art. However, because of the cost and complexity of the manufacturing process and equipment, it is often not practical to build facilities to manufacture a particular backplane. Instead, a foundry model was been widely adopted in the industry where the functional characteristics of microelectronic devices have become more standardized. This standardization allowed design to be split from manufacture. A design that obeyed the appropriate design rules could be more easily and cheaply manufactured by different companies that had compatible manufacturing methods. For this reason, the control circuitry on silicon backplanes is generally limited to the use of standard components selected from a range of options provided by the manufacturer of the backplane. For example, a manufacturer of silicon backplanes may provide the option of incorporating various designs of transistors such as 1.8V, 2.5V, 3.3V, 5V, 8V and 12V into a customer's design, but would not be able to provide (without great expense) transistors that are not included in the offered designs. By low-voltage, it is meant that the analog microelectronic components used in the circuitry in backplane 1 is sized, designed and certified/rated to operate at 5V or less or most desirably, 3.5V or less. It should be noted that these voltage ratings are set by the manufacturers and the manufacturers do not recommend exceeding the set maximum voltage for the various components.

Generally speaking, the backplane will be flat with a uniform thickness. Since silicon backplanes are generally opaque, the base microdisplay as well as the OLED amplification unit is preferably top-emitting. However, transparent backplanes are known; in such cases, the base display may be top- or bottom-emitting so long as the OLED amplification is in the emission pathway. The top surface of the substrate is that facing the amplification unit. The silicon backplane may have various types of subbing layers (i.e., planarization layers, light management layers, light blocking layers, etc.) which may be patterned or un-patterned and can be either on the top or bottom surfaces.

It is important that the base display 2 emits light that will be received by and activates the overlying photodiode layer 13 in the stacked OLED amplification structure 11. Thus, if the photodiode layer is sensitive to a single color of light or light within a certain range of wavelengths, the base microdisplay 2 should emit at least light of that color or range. Desirably, for full color (for example, RGB) integrated microdisplay devices, the base microdisplay will emit non-visible light; that is, UV or even more desirably, IR light, particularly NIR light. Desirably, for a monochrome integrated microdisplay devices, the base microdisplay will emit either non-visible light; (that is, UV or even more desirably., IR light, particularly NIR light) or light of wavelength less than that emitted from the front surface of the integrated microdisplay device. In particular, for a G monochrome integrated microdisplay device, the base display could emit red light. Using a base microdisplay unit that emits non-visible light or light of lower energy that that emitted from the integrated device avoids interference from the light generated by the OLED amplification unit or from external light entering from the front surface of the integrated device. However, in some cases, it may be still desirable that the base display and the overlying OLED amplification structure emit the same color of light (and the PD is sensitive to that color of light). Moreover, IR or NIR emitter molecules could be included in all or some of the OLED units of the OLED amplification structure that generate visible light, or separate OLED units could be added which generate only IR or NIR light. This will enhance the avalanche mode since some of the IR or NIR light emitted by the OLED amplification structure will be reabsorbed by the PD layer As illustrated, in FIG. 5, the top (second) electrode 26 of the base microdisplay 2 is not encapsulated and would be encapsulated later by top surface 25. However, it is possible in some embodiments that the base display 2 is encapsulated before the OLED amplification structure is added. Connection layer 9 would then be located over the encapsulation of the base display. In such cases, the base display 2 is used as an independent prefabricated component. Without regard to whether the base microdisplay is encapsulated, there may be additional layers located between the top electrode layer 26 and the connection layer 9 in order to modify its properties or provide protection during manufacture.

Over the base microdisplay 2 can be a transparent connector layer 9 if desired. The connector layer 9 serves to protect the upper surface of the base microdisplay 2, serves as a base to the overlying OLED amplification structure 11 and allows the image-wise passage of light from the base microdisplay 2 to the OLED amplification structure 11. The connector layer may not be necessary in some embodiments; its presence is optional. If the connection layer 9 is omitted, then it is possible that the top electrode 26 of the base microdisplay may be common with the bottom OLED electrode 12. The connection layer 9 may be composed of organic or inorganic materials. Suitable inorganic materials include metal oxides or nitrides such as aluminum oxide, silicon dioxide or silicon nitride. Suitable organic materials would be polymers such as polyimide. The thickness of the connection layer 9 should be in the range of 10-1000 nm, desirably as thin as possible to minimize light absorption in the wavelength range of the light generated by the base display. Since light generated by the base display as well as the OLED units should pass through the connector to the PD layer in order to create an avalanche effect, the connector should be transparent to the light emitted from both.

It is also important that connector layer 9, when present, not cause any light scattering. Light scattering would cause loss of resolution of the image from the base microlayer 2 to the OLED amplification unit 11 through increased cross-talk between neighboring pixels. It would be desirable that the refraction index (RI) of the connector layer 9 be matched as close as possible to the layers immediately adjacent to its top and bottom surfaces. By 'matched', it is meant that the differences in RI between connector layer 9 and its adjacent layers are as small as possible. If possible, the RI of connector layer 9 should being intermediate between the RI of the two adjacent layers. There may be additional layers located over the connector layer 9 in order to modify its properties or provide protection to the underlying layers during manufacture.

Over the connector layer 9 is a stacked OLED amplification structure 11 with multiple OLED units which also comprises a photodiode (equivalently, a photoconductor or photosensor) layer 13. The photodiode (PD) layer is located above the base display 2 and is part of the OLED amplification structure 11. Ideally, it is located within the encapsulation of the OLED structure.

A photodiode (PD) is a light-sensitive semiconductor diode. It produces current when it absorbs photons. A photodiode can use a PIN junction or a p-n junction, to increase the speed of response. Photodiodes usually have a slower response time as their surface area increases. When a photon of sufficient energy strikes the diode, it creates an electron-hole pair. This mechanism is also known as the inner photoelectric effect. If the absorption occurs in the junction's depletion region, or one diffusion length away from it, these carriers are swept from the junction by the built-in electric field of the depletion region. Thus, holes move toward the anode, and electrons toward the cathode, and a photocurrent is produced. The total current through the photodiode is the sum of the dark current (current that is generated in the absence of light) and the photocurrent, so the dark current must be minimized to maximize the sensitivity of the device.

Photoconductivity is an optical and electrical phenomenon in which a material becomes more electrically conductive due to the absorption of electromagnetic radiation such as visible light, ultraviolet light, infrared light, or gamma radiation. Photodetectors, also called photosensors, are sensors of light or other electromagnetic radiation. When light is absorbed by a photodiode, the number of free electrons and holes increases, resulting in increased electrical conductivity. To cause excitation, the light that strikes the semiconductor must have enough energy to raise electrons across the band gap, or to excite the impurities within the band gap. To first order, for a given spectral distribution, the photocurrent is linearly proportional to the irradiance.

When exposed to the image-wise light from the underlying base display 2, the photodiode layer 13 initially generates, in proportion to the amount of light from the base display 2, either a current sufficient to cause emission from the OLED stack, or become electrically conductive enough, in the presence of a separate electric field, to pass current into the OLED units so that light is emitted from the OLED units.

The PD is a flat layer located underneath or within the electrodes of the stacked OLED structure and is not located laterally to the stacked OLED structures. In embodiments where the OLED units are located between two electrodes that supply power, the photodiode layer is located between the two electrodes of the stacked OLED structure and may be present between any of the OLED layers. Desirably, it is located between the lowest or bottom-most OLED unit and the bottom electrode and most desirably, between the lowest layer (which can be non-light emitting) associated with the OLED structure and the bottom electrode. Most desirably, it is located directly adjacent to the bottom electrode or at most, separated from the electrode by no more than one layer. In some embodiments where there are electrodes that are not powered or there is only one electrode associated with the OLED structure (where the PD layer acts as the other electrode), the photodiode layer is desirably located between the lowest or bottom-most OLED unit and connector layer 9 and most desirably, between the lowest layer (which can be non-light emitting) associated with the OLED structure and the bottom electrode.

In order to generate a feed-back loop or avalanche mode in the amplification unit, the PD must be sensitive to both the light emitted by the base display and the light emitted by the OLED units. When the PD needs to be sensitive to a wide range of wavelength of light or two or more separate regions of light, a combination of two (or more) photodiode materials may be used, either as an admixture or in separate layers. For example, a PD layer may be composed of one PD material that is sensitive to IR or NIR light along with a second photodiode material that is sensitive to light that is emitted by the stacked OLED. A third host or acceptor material may be present as well. A mixture of a fullerene and a phthalocyanine is preferred as a PD for absorption in the NIR (input light) as well as visible light from the stacked OLED.

The PD can be an inorganic PD or an organic PD. The material used to make a photodiode is critical to defining its properties, because only photons with sufficient energy to excite electrons across the material's bandgap will produce significant photocurrents. Known inorganic PDs include Silicon, Germanium, Gallium Nitride, Indium gallium arsenide, Lead (II) sulfide and Mercury cadmium telluride. Organic photodiode (OPD) materials are well known; preferred are fullerenes such as C60 and C70 or phthalocyanines such as aluminum chlorophthalocyanine (ClAlPc). ClAlPc is a well-known photodiode material used in organic photovoltaic devices. ClAlPc absorbs in the near-IR region and fluoresces around 650 nm (for example, see Hadiyanto et al, "Transparent photodetectors with ultra-low dark current and high photoresponse for near-infrared detection", Organic Electronics, 99, 106356 (2021)). Such organic photodiode materials (often referred to as a donor) can be used in combination with a host material (often referred to as an acceptor). Often one material with the desired bandgap is used to absorb the photon and generate the electron-hole pair. A second material is often used to assist in the separation of the charges and the conduction of the charges. The materials can be in separate layers or mixed together. Organic PD materials are preferred.

When located between the electrodes of the OLED stack, the PD layer can be reverse biased. In this case, the electron-hole pair are separated by an externally applied electric field. For example, in device 50, the PD can be reverse biased and the OLED is forward biased by the charge applied to the top and bottom electrode. A reverse biased PD can have dark current (current that is generated in the absence of light) as well as generated photocurrent, so the dark current must be minimized to maximize the sensitivity of the device.

In some embodiments, the PD layer may be patterned. In some embodiments, the PD layer is patterned so that it is still a single layer but is designed so that it does not cover the entire surface of the substrate. In other embodiments, the PD layer may be patterned into individual segments that are electrically isolated from each other. This is particularly desirable for pixelated display devices. For example, the PD layer can be patterned into a striped or a checkerboard design. In some embodiments, different segments of the PD layer may have a different formulation from other PD segments. Individual PD segments should be electrically isolated from each other.

There are two basic approaches to making a suitable stacked OLED amplification structure which results in a visibly colored pixelated display, either full color (i.e., RGB) or monochrome (i.e., G). The first approach for a full colored display involves having each pixel individually produce red, green or blue light (R, G, B respectively). The second approach is to have a common multimodal (white) light emitting OLED layer across all pixels with a color filter array (CFA) in order to produce individual RGB pixels. The second approach has an advantage over the first in that it is not necessary to create individual OLED pixels of different formulations and so, manufacturing costs and complexity will be reduced.

In one embodiment, all of the OLED light-emitting units within the stacked OLED amplification structure above an individual bottom electrode segment emit the same color; for example, red, green or blue. This results in a pixelated RGB microdisplay.

Figure 6:
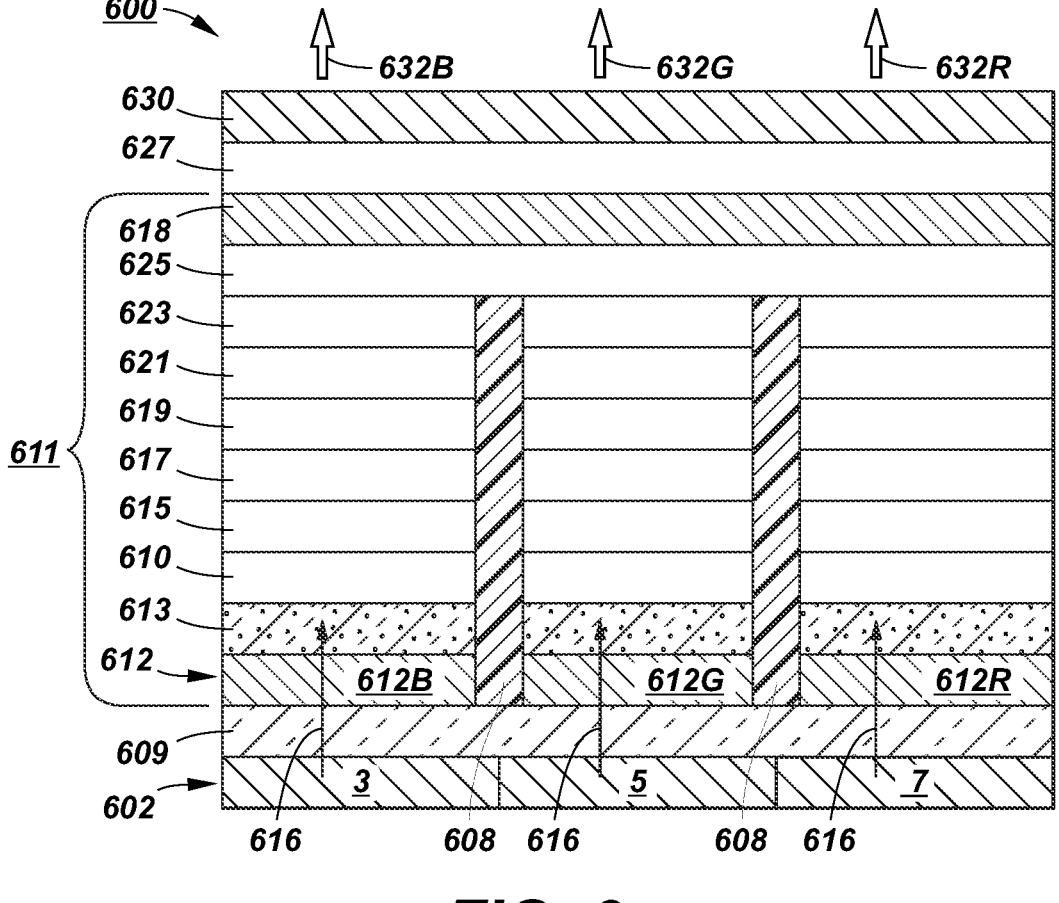
FIG. 6 shows a cross-sectional view of integrated display device 600.

FIG. 6 illustrates one embodiment of an integrated display device 600 that uses three different OLED stacks 611 to create R, G and B pixels 632B, 632G, 632R. Each OLED stack 611 contains three OLED light-emitting units 615, 619, 623 that emit the same color in which each unit is vertically separated from another unit by a CGL 617, 621. Since this embodiment emits RGB light, it would be desirable that the PD is sensitive to at least one of these colors of light as well as IR or NIR light (which would be the input light). Ideally, the PD is patterned into segments which are at least partially "false colored"; that is, the pixelated light (i.e., 616) from the base display is different from the light emitted from the stacked OLED.

Three stack OLED structure 611 would be located over a base display 602 (with pixels 3, 5, 7) and optional transparent connector layer 609. Over 609, there are transparent first electrode 612 segments 612B, 612G, 612R that are separated by an electrically insulating material (pixel definition layer) 608. Over the bottom electrode segments are PD layer segments 613. Over 613, there are non-light-emitting OLED layers 610, such as electron- or hole-injection (EIL or HIL) or electron- or hole-transport (ETL or HTL) layers. A first light-emitting OLED unit 615 is over OLED layers 610. Layer 617 is a charge-generation layer which lies between and separates the first light-emitting unit 615 and a second light-emitting OLED unit 619. Over the second light-emitting OLED unit 619, there is a second charge-generation layer 621 that lies between and separates the second light-emitting OLED unit 619 and a third light-emitting OLED unit 623. Over the third light-emitting unit 623 are nonlight-emitting OLED layers 625, such as electron- or hole-transport layers or electron- or hole-injection layers, and transparent top electrode 618 through which light can be transmitted. Over 618 is an optional top layer 627. OLED 611 is protected from the environment by an encapsulation layer 630. Encapsulation layer 630 may act as the uppermost layer or surface of the integrated device, or alternately top layer 627 may be present over the encapsulation 630. In the embodiment shown, all the layers between the bottom electrode segments 612B, 612G, 612R and OLED layer 625 within a single OLED stack are separated horizontally from the adjacent stack by a pixel definition layer 608. The top electrode 618, optional top layer 627 and the encapsulation 630 are in common and extend across the entire active area. However, the top electrode 618 and optional top layer 627 need not be continuous and can be segmented if desired. There is a power source (not shown) electrically connected between 612B, 612G, 612R and 618.

In 611, each vertically stacked segment of the OLED light-emitting units 615, 619, 623 above the bottom electrode segment 612B, 612G, 612R emits the same color of light, either B, G or R. For example, all of the OLED units above 612B form a pixel 632B that emits B light, all of the OLED units above 612G form a pixel 632G that emits G light and all of the OLED units above 612R form a pixel 632R that emits R light as indicated by the arrows. Alternatively, OLED unit 615 can emit one color of light (i.e., B) in each of the stacks above 612B, 612G, 612R, while 619 can emit another (i.e., G) in each stack and 623 can emit a third color (i.e., R) in each of the stacks. In this way, all of the stacked OLED structures emit the same color of light (i.e., all pixels emit W) and colored pixels can be formed by using the appropriate color filters in the light path. It is also possible that all of the OLED units (and the resulting pixels) emit the same color so that the display is monochromatic.

Upon irradiation of 611, a photocurrent is generated by the PD segments 613 can be transferred to the bottom electrode segment or directly to the overlying OLED stacks. Photocurrent then causes the overlying stacked OLEDs 611 to emit light in a pixelated form as a function of the pixelated emission from the base display 601.

Both the bottom electrode 612 and the PD 613 layer may be continuous (instead of being segmented as shown) while the OLED layers remain segmented in pixels by 608. While stacked OLED 611 is not a microcavity device, it can be modified to use a microcavity effect to further maximize its emission. It is also possible to locate a PD between the bottom electrode segments and the substrate. For example, electrically isolated (by 608) segments of the PD can be located between the bottom electrode segments 612B, 612G, 612R and the base display 601. The connecting layer 609 may be segmented or not as desired.

Figure 7:
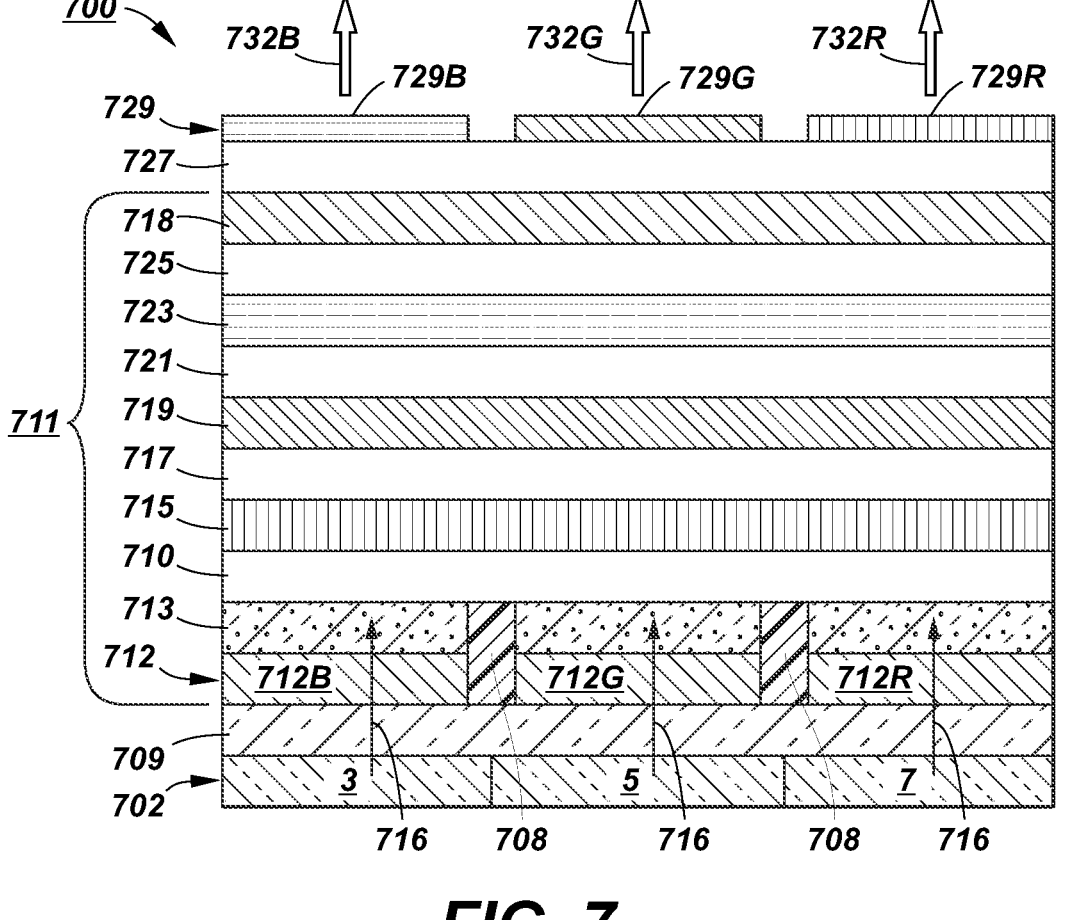
FIG. 7 shows a cross-sectional view of integrated display device 700.

FIG. 7 illustrates one embodiment of an integrated display device 700 that uses a three-stack multimodal (white) OLED structure (711) that is common across all pixels together with a color filter array (CFA) to create R, G, and B pixels (732B, 732G, 732R). A multimodal OLED produces more than one color of light. Ideally, a multimodal OLED produces a white light with roughly equal amounts of R, G and B light. Typically, this would correspond to $CIE_x$, $CIE_y$ values of approximately 0.33, 0.33. However, some variation from these values is still acceptable or even desirable depending on the characteristics of the color filters used to create RGB pixels. In this embodiment, the multimodal OLED stack contains three OLED light-emitting units that emit different colors in which each unit is vertically separated from another unit by a CGL. The stacked OLED of this embodiment emits RGB (W) light and it would be desirable that the PD be sensitive to at least one color of light emitted by the stacked OLED as well as IR or NIR light.

Three stack OLED 711 would be located over a base display 702 (with pixels 3, 5, 7) and optional transparent connector layer 709. Over 709, there are transparent first electrode segments 712B, 712G, 712R that are separated by an electrically insulating material (pixel definition layer) 708. Over the bottom electrode segments are PD layer segments 713. Over 713, there are non-light-emitting OLED layers 710, such as electron- or hole-injection (EIL or HIL) or electron- or hole-transport (ETL or HTL) layers. A red OLED light-generating unit 715 is over OLED layers 710. Layer 717 is a first charge-generation layer which lies between and separates the red OLED light-generating unit 715 and a green OLED light-generating unit 719. Over the green light-emitting unit 719, there is a second charge-generation layer 721 that lies between and separates the green OLED light-generating unit 719 and a blue OLED light-generating unit 723. Over the blue OLED light-generating unit 723 are nonlight-emitting OLED layers 725, such as electron- or hole-transport layers or electron- or hole-injection layers, and transparent top (second) electrode 718. There is a power source (not shown) between 712B, 712G, 712R and 718. The stacked OLED 711 is protected from the environment by an encapsulation layer 727.

Over 727, there is a top layer 729 which contains a color filter array with color filters 729B, 729G and 729R which filter the multimodal emission generated by the OLED 711, thus forming colored pixels 732B (emits B light), 732G (emits G light), 732R (emits R light) according to the photocurrent from the activation of the photodiode.

Both the bottom electrode 712 and the PD layer 713 might be continuous instead of being segmented as shown. The emission from the stacked OLED 711 can be arranged to be monochromatic where all light-emitting units emit the same color. It is also possible to locate a PD between the bottom electrode segments and the substrate. For example, electrically isolated segments of the PD 713 can be located between the bottom electrode segments 712B, 712G, 712R and 702, preferably between 709 and the electrode segments 712. While 711 is not a microcavity device, it can be modified to use a microcavity effect to further maximize its emission.

In the stacked OLED structures, the bottom electrode segments can be an anode or a cathode and are transparent. Preferably, the bottom electrode can be made of transparent metal oxides (ITO or AZO preferred) having a thickness of at least 30 nm, desirably at least 60 nm, or thin transparent metals such as Al, Au, Ag (preferred), Mg or alloys thereof having a thickness of no more than 20 nm, desirably no more than 10 nm. Desirably, the bottom electrode is a transparent anode preferably having a transmittance of at least 70% or more desirably at least 80%. The electrodes of the amplification structures (if present) can be continuous layers since they are not used in terms of the image signal but rather used to apply a common bias across the entire unit. However, in some applications, one or both electrode layers may be patterned so that the bias is applied to some areas but not others.

Electron-transport and hole-transport materials suitable for use in non-emitting layers such as hole-injection layers, hole-transport layers or electron-injection layer or electron-transport layers are well-known and commonly used. These layers may be mixtures of such materials and may contain dopants to modify their properties. Since they are non-light emitting, they do not contain emitting materials and are transparent. The choice of appropriate materials is not critical and any may be selected based on their performance.

Light-emitting layers typically have a host material (or a mixture of host materials), which is the primary component of the layer, and a light-emitting compound. Desirably, the light-emitting compounds are phosphorescent as these have higher efficiency. However, in some instances, some LELs may use fluorescent or TADF (thermally activated delayed fluorescent) compounds as materials for light emission while others use phosphorescent materials. In particular, the blue light-OLED layers may use fluorescent or TADF compounds or combinations thereof while non-blue light-emitting layers may use green, yellow, orange or red phosphorescent compounds or combinations thereof. Light-emitting layers may use combinations of light-emitting materials. The choice of appropriate materials for LELs is well known, is not critical, and any may be selected based on their performance and emission characteristics. When using phosphorescent emitters, it is sometimes necessary to confine the excitons generated by the phosphorescent emitter within the layer. Thus, exciton-blocking layers on either side, or both, of the phosphorescent LEL can be used if necessary. Such materials and their application are well known.

The top electrode of the OLED amplification structure is transparent and desirably, composed of the same materials as the bottom electrode. A thickness of the upper electrode layer is desirably 50-200 Å, and more desirably 125-175 Å.

There may be protective or spacing layers over the top electrode to prevent damage during encapsulation or during further manufacturing operations.

Over the top electrode and any optional protective layers, if present, is deposited or placed encapsulation which can in some embodiments also serve as the top layer. At a minimum, the encapsulation should fully cover the light-emitting area on the top and sides and is in direct contact with the substrate. The encapsulation should be impervious to air and water penetration. It is transparent. It should not be electrically conductive. It may be formed in-situ or added as a separate pre-formed sheet along with provisions for sealing the side edges. An example of in-situ formation would be thin-film encapsulation. Thin-film encapsulation involves the deposition of multiple layers with alternative layers of inorganic materials and polymeric layers until the desired degree of protection is achieved. Formulations and methods to form thin-film encapsulation are well known and any can be used as desired. Alternatively, encapsulation may be provided using a pre-formed sheet or cover slip which is attached over at least the sealing area and enclosed area. The pre-formed sheet may be rigid or flexible. It could be made of glass (including flexible glass), metal or organic/inorganic barrier layers. It should have a thermal expansion coefficient that is close to the substrate to achieve a more robust connection. Pre-formed encapsulation sheets may need to be attached over the sealing area using air and water proof adhesives such as silicon or epoxy adhesives or by thermal means such as ultrasonic welding or glass frit welding, which may require additional sealants such as solder or glass frit. The side and bottom edges of the cover slip can be specially designed to have better fit to the sealing area or promote a better seal. The cover slip and sealing area may be designed together so that they fit or lock partially in place before the seal is formed. Moreover, the cover slip may be pretreated to promote better adhesion to the sealing area.

However, since the top surface (including the encapsulation) of the OLED amplification structure 11 must be transparent to visible light, it is possible that external light from the environment can penetrate and activate the internal photodiode layer within the OLED amplification structure. This would cause the system to fail. For this reason, devices with this simple structure would be advantaged when viewed in a dark environment such as within a VR headset.

However, when the system is used in an open lighted environment, the photodiode layer 13 within 11 should not be affected by any light that can penetrate through the top layer of the OLED amplification structure 11. The photodiode layer in 11 should be sensitive to and activated by the light produced by the base display 2 as well as the OLED units. For this reason, the photodiode layer within 11 should be sensitive to the light produced by the base microdisplay 2 located below 11 while the top layer 25 is used to prevent that same type of light from entering from the top surface of 11.

For example, if the photodiode layer 13 is sensitive to UV light (because the base display emits UV light), then external UV light should be prevented from light reaching the photodiode layer. If the photodiode is sensitive to IR or NIR (because the base microdisplay emits IR or NIR light), then external IR or NIR should be prevented from reaching the photodiode layer If the photodiode is sensitive to R light (as for a G monochrome integrated device), the top layer should prevent R light from entering the device. Thus, the top layer 25 should prevent external light from entering the device by absorbing that light while still allowing visible light to pass. It is desirable that the top surface of the integrated OLED display or front emission surface of the OLED amplification unit contains materials that absorb the same spectrum of light that is emitted by the base display.

When the system is used in a lighted environment, the drive system of the display must be adjusted to avoid triggering an avalanche response from the light entering the display from the environment. A preferable way to do this is to adjust the bias on both the OLED amplification section and base display section, and the variation of these bias voltages over the frame time to reduce or eliminate triggering of the avalanche behavior by environmental light while maintaining a good tone-scale on the display. In general, for a display to be useful, it must be much brighter than the environment in order for it to display an image with good contrast. The controls of the display can adjust the bias voltages to prevent image formation due to triggering on the surrounding light which enters the display. The advantage of this light intensification display is that it can achieve high brightness (using low voltage backplane technology) and hence be useful in high-brightness applications including in bright surroundings.

The OLED amplification structure 11 can emit W light via discrete RGB stacks which may or may not have RGB color filters or W light via common layers which will require color filters. Thus, the color filters may be incorporated as part of the top layer. While the color filters may provide sufficient UV/IR protection alone, the remaining top layer may provide additional protection against external exposure of the photodiode. Desirably, the top layer is continuous, but may be patterned in some embodiments. The top layer may have multiple separate layers.

One problem with the use of smaller pixels with increased pixel density in the active area is cross-talk between neighboring pixels. This is a particular problem in OLED microdisplays since the light within the OLED light-emitting units is emitted in all directions and so, light will be scattered in all directions within the OLED stack. Escape of light that is generated in one pixel but exiting from the device through another pixel is undesirable. This problem can be somewhat mitigated through the use of appropriate pixel definition layers or other techniques to prevent light from escaping from the pixel where it is generated. The use of multimodal microcavity OLED stacks with common layers also increases the problem because of lateral carrier migration. In some instances, significant pixel cross-talk problems can still exist and techniques and methods to further reduce the cross-talk are useful in combination with the OLED amplification structure.

Figures 8, 9:
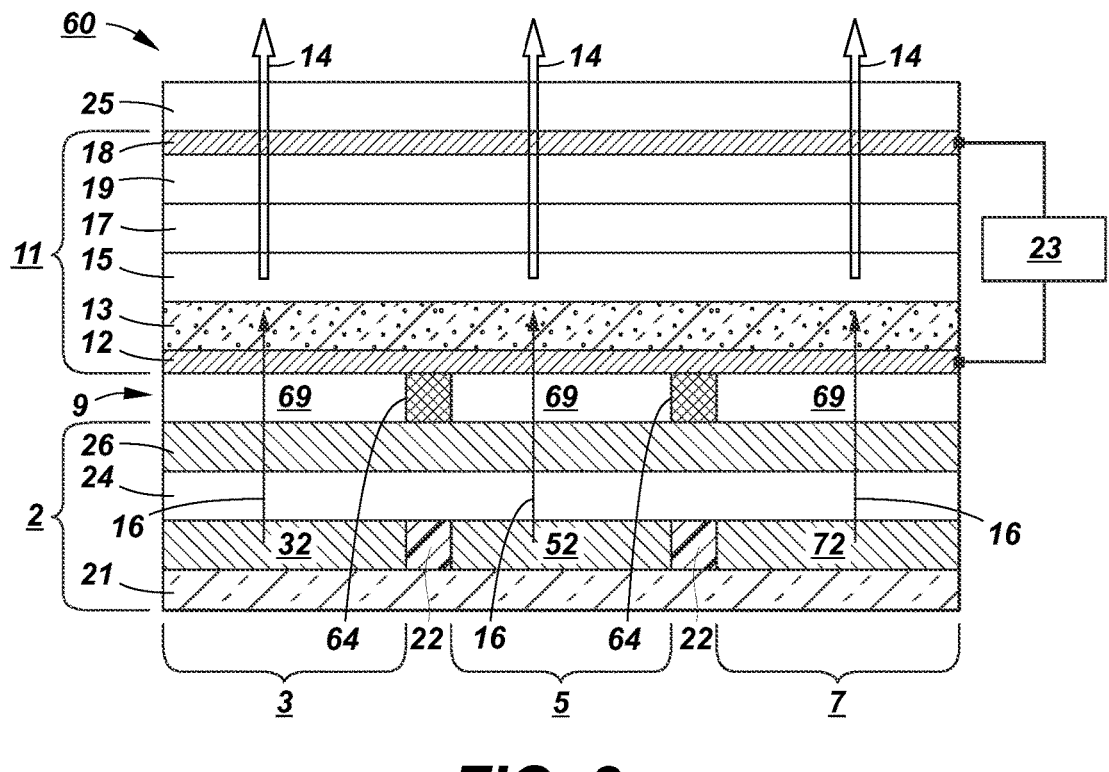
FIG. 8 shows a cross-section view of an integrated microdisplay device 60.
FIG. 9 shows a cross-section view of an integrated microdisplay device 70.

FIG. 8 illustrates one solution to the problem of cross-talk. Integrated microdisplay device 60 is similar to 50 (FIG. 5) except that connector layer 9 has been divided into segments 69 which are separated by opaque dividers 64. The opaque dividers are located directly above the insulating material 22 that separates the electrode segments 32, 52, 72 in the base microdisplay display 2. The connector layer segments 69 lie directly above the electrode segments 32, 52, 72. When light is generated in the light-emitting layer 24 of the base microdisplay 2, most will pass through the overlying connector segment 69 but the off-axis light (the source of optical cross-talk) is blocked by the opaque dividers 64. This reduces the dispersity of the light generated from the pixels of the base microdisplay 2 and so, the off-axis light from one pixel will not cause the photodiode in the OLED amplification 11 above another pixel to become active. The opaque dividers 64 may be larger in width than the underlying insulating material 22 in order to further reduce the diversity of light emitted from the base microdisplay 2.

The opaque dividers should absorb the light that is generated by the base microdisplay. For example, the opaque divider may absorb IR light if the base microdisplay 2 emits IR light. Alternatively, or in addition, the opaque divider may be black so it that absorbs visible light. Desirably, the opaque divider is composed of photoresist materials created by photolithography or materials deposited via vacuum deposition using masks. Alternatively, the opaque divider may be made of reflective metal if separated from overlying or underlying electrodes by electrically insulating layers.

The height of the opaque dividers 64 may also be increased so that they form a pixel definition layer similar to 608 in FIG. 6. They may or may not extend through all layers of the OLED amplifying structure 11. This will confine the light emitted from the base microdisplay 2 to just those areas in 11 directly above the emitting pixel. Moreover, any cross-talk due to lateral carrier migration in layers separated by the opaque divider acting as a pixel definition layer is not possible.

Another alternative to reduce cross-talk is shown in FIG. 9. Integrated microdisplay device 70 is similar to 10 in FIG. 1. The base microdisplay 2 is divided into emitting pixels 3, 5, 7. Over the top surface of 2, opaque dividers 74 are located between the emitting pixels. Connector layer 9 and OLED amplification structure 11 are then applied over the top surface of the base display 2 as well as the opaque dividers 2. The height and shape of the opaque dividers 74 above the top surface of the base microdisplay 9 is selected so that the connector layer 9 and OLED amplification structure 11 can form continuous layers over the opaque divider and the top surface of the base microdisplay 2 between the opaque dividers 74. This will reduce cross-talk by reducing the diversity of light emitted by the individual pixels of the base microdisplay and confining the light to that part of 11 that lies directly above the pixel. This embodiment is advantaged for manufacture because 9 and 11 are both continuous over the surface of the base microdisplay and do not require any patterning of these layers. Moreover, although 9 and 11 are continuous in this embodiment, cross-talk caused by lateral carrier migration is also reduced because the pathlength between different pixel areas is increased. The opaque dividers 74 can also extend through the top surface of the base microdisplay. For example, opaque dividers 74 can replace 22 in 20 (see FIG. 2) where 24 and 26 also form continuous layers over the opaque divider 74.

One well-known method of increasing the luminance and color purity of OLED emission is by taking advantage of the optical microcavity effect. An optical microcavity is a structure formed by a reflecting surface on one side of the microcavity and a semitransparent surface on the opposite side. Multiple reflections between the two surfaces create standing waves, depending on optical distance between the two surfaces, which will intensify some wavelengths of light and decrease others because of constructive and destructive interference effects that will occur depending on whether the emissions are generated at the anti-nodes or nodes, respectively, of the standing waves. The anti-nodes occur at different locations depending on the total space between the reflectors, and on the wavelength being optimized. Optical models based on mathematical calculations can be useful in determining the ideal emitter positions for a given structure. In general, modelling of an OLED microcavity suggests that the maximum emission efficiency will be found if the light is generated at an antinode that is some odd multiple of a quarter wavelength between the reflective and semi-transparent surfaces of the microcavity, when adjusted for any phase shifts at the two reflectors. The antinodes for different "colors" will be at different locations within the microcavity since the wavelengths are different. In this case, quarter-wavelength refers to the wavelength within the device medium, not vacuum. In other words, theory predicts that emitting layers according to the emission wavelength should be located at specific distances (i.e., at the antinodes)

between the defining surfaces of the microcavity in order to maximize the microcavity effect that increases efficiency.

In integrated microdisplay devices, the bottom electrode segments can be reflective. There are two possible top electrodes which may form a microcavity. The first is the top electrode 26 of the base microdisplay 2. The distance between the bottom electrode segments 32, 52, 72 and the top electrode 26 and the positioning of the intermediate light-emitting layer 24 may be selected based on the emission wavelength in order to provide a microcavity effect. The other electrode (if present) can be the top electrode 18 of the OLED amplification unit 11. Top electrode 18 cannot be completely reflective and must be at least semi-transparent. In this case, the microcavity would be between top electrode 18 and the bottom electrode segments 32, 52, 72. The distance between the bottom electrode segments 32, 52, 72 and the top electrode 18 and the positioning of one or both of the intermediate light-emitting units 15, 19 may be selected based on the emission wavelength in order to provide a microcavity effect.

EXPERIMENTAL

The following OLED amplification structures A-D were prepared over a glass substrate according to Table 1:

TABLE 1

Composition of OLED Amplification Structures A, B, C and D

| Layer | Type | Composition | A | B | C | D |
|---|---|---|---|---|---|---|
| | | | | Thickness (Å) | | |
| 1 | Electrode | ITO | 1400 | 1400 | 1400 | 1400 |
| 2 | HIL | C70 | 500 | 500 | | |
| 3 | HIL | HTM-A + 6% P-Dopant | | | 100 | 100 |
| 4 | HIL | HTM-B | | | 100 | 100 |
| 5 | PD | ClAlPc + 75% C70 | 500 | 500 | | |
| 6 | EBL | HTM-B | 500 | 500 | 500 | 500 |
| 7 | G LEL#1 | GHP + 10% GD | 300 | 300 | 300 | 300 |
| 8 | HBL | ETM-A | 100 | 100 | 100 | 100 |
| 9 | ETL | ETM-B | 25 | 100 | 25 | 100 |
| 10 | CGL #1 | See Table 4 | | 450 | | 450 |
| 11 | EBL | HTM-B | | 70 | | 70 |
| 12 | G LEL #2 | GHP + 10% GD | | 300 | | 300 |
| 13 | HBL | ETM-A | | 100 | | 100 |
| 14 | ETL | ETM-B | 25 | 100 | 25 | 100 |
| 15 | CGL#2 | See Table 4 | | 370 | | 370 |
| 16 | EBL | ETM-B | | 70 | | 70 |
| 17 | G LEL#3 | GHP + 10% GD | | 300 | | 300 |
| 18 | HBL | ETM-A | | 100 | | 100 |
| 19 | ETL | ETM-B | 25 | 50 | 25 | 50 |
| 20 | EIL-1 | ETM-B + 0.005% Li | 500 | 500 | 500 | 500 |
| 21 | EIL-2 | ETM-B + 2% Li | 100 | 100 | 100 | 100 |
| 22 | Electrode | Ag | 400 | 400 | 400 | 400 |

TABLE 2

Composition of CGL #1 and #2 in Table 1

| Layer | Composition | CGL #1 | CGL #2 |
|---|---|---|---|
| | | Thickness (Å) | |
| 1 | ETM-B + 2% Li | 100 | 100 |
| 2 | ETM-B | 100 | 70 |
| 3 | HTM-A + 6% P-Dopant | 150 | 150 |
| 4 | HTM-A | 100 | 100 |

In Tables 1 and 2, HTM-A and HTM-B are commercially available hole transport materials. P-Dopant is a commercially available organic dopant. ETM-A and ETM-B are commercially available electron transport materials. GHP is a commercially available green host material and GD is a commercially available green phosphorescent emitter. These stacked OLED amplification structures have 3 green light-emitting stacks, separated by 2 CGLs. OLED amplification structure A is a comparative device with a PD with a single OLED unit where C is the same with a non-sensitive HIL/HTL replacing the PD layer. OLED amplification structure B is an inventive stacked OLED with 3 OLED units separated by two CGLs where D is the same with a non-sensitive HIL/HTL replacing the PD layer. The PD in OLED amplification structures in A and B is sensitive to both red light as well as green light.

For testing, the OLED amplification structures A-D were placed over a red-light emitting OLED device (as a base display) which was then powered at 0.001 A/cm$^2$, 0.1 A/cm$^2$ and 1.0 A/cm$^2$ or no power (dark) while the voltage applied to the OLED amplification units was varied from 0-20 V.

Figures 10, 11:
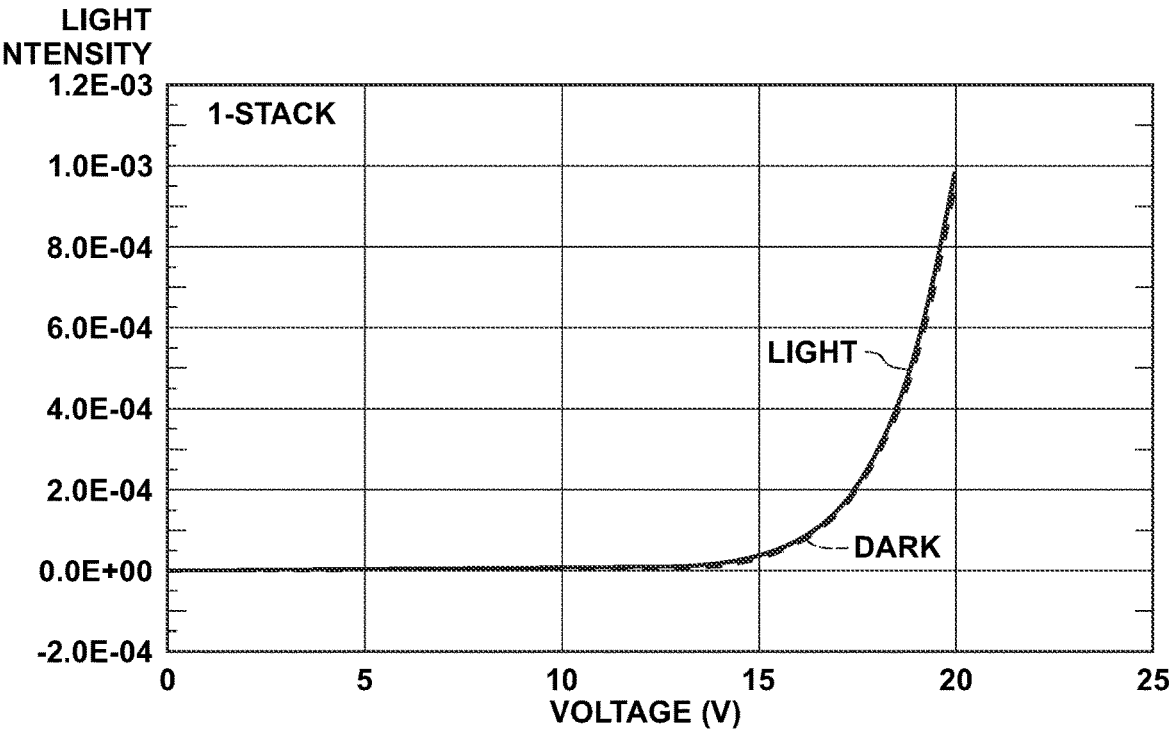
FIG. 10 shows the emission vs voltage response for a comparative integrated display device A.
FIG. 11 shows the emission vs voltage response for an inventive integrated display device B.

FIG. 10 shows the results for comparative OLED amplification structure A where the voltage was varied from 0-20 V while base display was either dark or light (1.0 A/cm$^2$). There is only a very small amount of increased emission when the PD is exposed to red light compared to no exposure (dark).

FIG. 11 shows the results for inventive OLED amplification structure B under the same experimental conditions. There is a large increase in light emission when the PD is exposed compared to no exposure (dark). Unit B, with an OLED with three G units separated by 2 CGLs can cause the device to enter an avalanche mode where the output emission (in this example, green) is greatly amplified when the PD is activated by inputted light (in this case, red) from a base display.

OLED amplification structures C and D without a PD are insensitive to inputted light. There is no difference in either of their responses to applied voltage whether or not the device is exposed to light from the base display.

In the above description, reference is made to the accompanying drawings that form a part hereof, and in which are shown by way of illustration specific embodiments which may be practiced. These embodiments are described in detail to enable those skilled in the art to practice the invention, and it is to be understood that other embodiments may be utilized and that structural, logical and electrical changes may be made without departing from the scope of the present invention. Features in one embodiment can also be applied to other embodiments if not incompatible. The description of any example embodiments is, therefore, not to be taken in a limiting sense. Although the present invention has been described for the purpose of illustration, it is understood that such detail is solely for that purpose and variations can be made by those skilled in the art without departing from the spirit and scope of the invention.

PARTS LIST

1 Backplane
2 Base Display
3, 5, 7 Pixels of the Base Display
9 Connector Layer
10 Integrated Display
11 OLED Amplification Structure
11A OLED Amplification Structure (without electrodes)
14 Emission from the OLED Amplification Structure
16 Emission from the Base Display
20 Base Display
21 Silicon Backplane of 20
22 Insulating Layer 30 Integrated Display
31, 51, 71 Individual Pixel Circuits within 21
32, 52, 72 First Electrode Segments of 20
24 Light-emitting Layers of 20
26 Top Electrode of 20
13 Photodiode layer
15 First OLED Light-Emitting Unit
17 Charge Generation Layer
19 Second OLED Light-Emitting Unit
18 Transparent Top Electrode for OLED Amplification Structure
25 Top Layer
40 Integrated Display
12 Transparent Bottom Electrode for OLED Amplification Structure
23 Power Source
50 Integrated Display
600 Integrated Display
602 Base display
608 Electrically Insulating material (Pixel Definition Layer)
609 Connector Layer
612 Transparent Electrode Layer
612B, 612G, 612R Individual Segments of the Transparent Electrode Layer
613 Photodiode Layer
610 Non-light Emitting Layer
611 Pixelated Three-Stack OLED structure
615 1$^{st}$ OLED Unit
617 CGL
619 2$^{nd}$ OLED Unit
621 CGL
623 3$^{rd}$ OLED Unit
625 Non-light Emitting Layer
618 Top Electrode
627 Top Layer
630 Encapsulation
632B, 632G, 632B Colored Pixels
700 Integrated Display
711 Multimodal Three-Stack OLED
702 Base display
708 Electrically Insulating material (Pixel Definition Layer)
709 Connector Layer
712 Transparent Electrode Layer
712B, 712G, 712R Individual Segments of the Transparent Electrode Layer
713 Photodiode Layer
710 Non-Light Emitting OLED layers
715 1$^{st}$ OLED Light-emitting Unit
717 1$^{st}$ Charge-Generation Layer (CGL)
719 2$^{nd}$ Light-Emitting Unit
721 2$^{nd}$ Charge-Generation Layer (CGL)
723 3$^{rd}$ Light-Emitting Unit
725 Non-Light Emitting OLED layers
718 Second Electrode
727 Encapsulation
729 Top Layer
729B, 729G, 729R Color Filters
732B, 732G, 732R Colored Pixels
60 Integrated microdisplay
64 Opaque dividers
69 Connector layer segments
70 Integrated microdisplay
74 Opaque dividers

The invention claimed is:

1. An integrated OLED display comprising a base display that emits a pixelated image and an overlying stacked OLED amplification structure where:

the stacked OLED amplification structure has at least two light-emitting OLED units separated by a charge-generation layer and a photodiode layer which generates a photocurrent upon exposure to light from the base display as well as the light emitted by the OLED units; wherein the pixelated emission from the base display causes pixelated light emission from the OLED amplification unit; and wherein the top surface of the integrated OLED display or front emission surface of the OLED amplification structure contains materials that absorb the same spectrum of light that is emitted by the base display.

2. The integrated OLED display of claim 1 where the photodiode layer is located between the OLED light-emitting unit closest to the base display and the emitting surface of the base display.

3. The integrated OLED display of claim 1 where the stacked OLED amplification structure has a top and a bottom electrode connected to a power source that supplies a non-imagewise bias that is applied uniformly across all pixels.

4. The integrated OLED display of claim 3 where the photodiode layer is located between the two electrodes of the stacked OLED amplification structure.

5. The integrated OLED display of claim 4 where the photodiode layer is located between the OLED light-emitting unit closest to the base display and the bottom electrode.

6. The integrated OLED display of claim 1 where the emission from the base display is monochromatic and the emission from the stacked OLED amplification structure is multicolor.

7. The integrated OLED display of claim 1 where the emission from the base display is monochromatic and the emission from the stacked OLED amplification structure is monochromatic but a different color from the base display.

8. The integrated OLED display of claim 7 where the base display emits IR, NIR or red light.

9. The integrated OLED display of claim 8 where the stacked OLED amplification structure emits green light.

10. The integrated OLED display of claim 1 where the base display comprises a light emitting OLED display on top of a silicon-based backplane with individually addressable pixels and control circuitry.

11. The integrated OLED display of claim 10 where the base display is an OLED microdisplay where the control circuitry in the backplane comprises low-voltage components which are nominally rated at 5V or less.

12. The integrated OLED display of claim 1 where the stacked OLED structure has at least some common layers across all pixels which additionally comprises optical dividers between the pixels of the OLED amplification structure wherein the optical dividers are located under the common layers of the stacked OLED structure and above the substrate.

13. The integrated OLED display of claim 12 wherein the optical dividers are located under the common layers of the stacked OLED structure and above the photodiode layer.

14. The integrated OLED display of claim 1 where the stacked OLED amplification structure additionally emits IR or NIR light.

* * * * *